United States Patent [19]
Dawson et al.

[11] Patent Number: 6,111,260
[45] Date of Patent: Aug. 29, 2000

[54] METHOD AND APPARATUS FOR IN SITU ANNEAL DURING ION IMPLANT

[75] Inventors: Robert Dawson; H. Jim Fulford, Jr., both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 08/872,258

[22] Filed: Jun. 10, 1997

[51] Int. Cl.⁷ .................................................. H01J 37/317
[52] U.S. Cl. .................................. 250/492.21; 250/443.11
[58] Field of Search ........................... 250/492.21, 443.11

[56] References Cited

U.S. PATENT DOCUMENTS

| | | | |
|---|---|---|---|
| 4,261,762 | 4/1981 | King | 250/443.1 |
| 4,680,061 | 7/1987 | Lamont | 250/492.21 |
| 4,724,300 | 2/1988 | Dearnaley | 250/492.21 |
| 5,354,986 | 10/1994 | Yamada et al. | 250/492.21 |

OTHER PUBLICATIONS

Smith, T. C., "Wafer Cooling and Photoresist Masking Problems in Ion Implantation", Fourth Int. Conf., Ion Implantation: Equipment and Techniques, Berchtesgaden, West Germany, Sep. 13–17, 1982.

Silicon Processing for the VLSI Era—vol. 1: Process Technology, by S. Wolf, published by Lattice Press, Sunset Beach, CA, 1986, pp. 182–195, 209–211, 280–283, 294, 308, 321–327.

Silicon Processing for the VLSI Era—vol. 2: Process Integration, by S. Wolf, published by Lattice Press, Sunset Beach, CA, 1990, pp. 124–131.

*Primary Examiner*—Jack Berman
*Attorney, Agent, or Firm*—Skjerven Morrill MacPherson L.L.P.; Ken J. Koestner; Margaret M. Kelton

[57] ABSTRACT

During a semiconductor substrate ion implant process thermal energy is supplied to raise the temperature of the semiconductor wafer. The increased temperature of the semiconductor wafer during implantation acts to anneal the implanted impurities or dopants in the wafer, reducing impurity diffusion and reducing the number of fabrication process steps. An ion implant device includes an end station that is adapted for application and control of thermal energy to the end station for raising the temperature of a semiconductor substrate wafer during implantation. The adapted end station includes a heating element for heating the semiconductor substrate wafer, a thermocouple for sensing the temperature of the semiconductor substrate wafer, and a controller for monitoring the sensed temperature and controlling the thermal energy applied to the semiconductor substrate wafer by the heating element. An ion implant device including a system for applying and controlling thermal energy applied to a semiconductor substrate wafer during ion implantation raises the temperature of the wafer to a temperature that is sufficient to activate impurities within the semiconductor substrate wafer when an ion beam is implanting ions to the wafer, but the temperature is insufficient to activate impurities when the ion beam is inactive.

19 Claims, 2 Drawing Sheets

METHOD AND APPARATUS FOR IN SITU ANNEAL DURING ION IMPLANT

BACKGROUND OF THE INVENTION

1. Field of the Invention

The present invention relates to semiconductor fabrication methods and devices. More specifically, the present invention relates to a method and apparatus for simultaneously annealing a substrate during ion implantation in situ.

2. Description of the Related Art

Doping is the process of introducing an impurity, called a dopant, into the crystal lattice of a semiconductor to modify the electrical properties, in particular the conductivity, of the semiconductor. Typically, doping is achieved either by diffusion or implanting ions into the semiconductor.

Diffusion is the process of introducing selected impurity atoms into predetermined areas of a semiconductor substrate to modify the electrical properties of the substrate. In a diffusion process, the semiconductor is heated to a predetermined temperature in a gaseous atmosphere containing a predetermined concentration of the impurity. Impurity atoms condense on the surface of the substrate and diffuse into the substrate in both the vertical and horizontal directions. A disadvantage of the diffusion process is that the location and concentration of impurities is difficult to control.

In the process of ion implantation, energetic, charged atoms or molecules are directly introduced into a substrate at acceleration energies generally ranging from 2 keV to 20.0 MeV.

Ion implantation is highly advantageous in comparison to diffusion for allowing precise control of the concentration of ions implanted into a substrate and for producing a much smaller lateral distribution of ions. A small lateral distribution of ions is useful for production of compact circuits and systems.

Unfortunately, ion implantation does have some disadvantages. Ion implantation cannot be achieved without causing damage (displaced atoms) to the material structure of the substrate. Damage includes crystal defects and formation of amorphous layers in crystalline targets. Furthermore, the impurities that are injected into the substrate are generally not positioned in substitutional sites that are suitable for electrical activation of the semiconductor.

Thermal processing after implantation is generally necessary to restore the substrate to a preimplantation condition. In some cases, significant damage resulting from ion implantation cannot be repaired. Thermal annealing is performed to repair isolated point defects and point defect clusters, and to transform locally amorphous regions of the substrate to a crystalline structure. Thermal processing is used not only to repair damage to the silicon substrate but also so move impurities to substitutional sites, thereby electrically activating the dopant.

In conventional semiconductor processing, semiconductor wafers are removed from an ion implant device and moved to a thermal processing chamber. Thermal energy is applied to the semiconductor wafers at a controlled temperature in the thermal processing chamber. At low temperatures of up to about 500° C. vacancies and self-interstitials in close proximity are recombined, curing trapping defects that otherwise capture free charge carriers and inhibit current flow in crystalline portions of the substrate. At medium annealing temperatures in the range from 500° C. to 600° C., dislocations form that capture impurity atoms. Higher annealing temperatures from 900° C. to 1000° C. dissolve the dislocations. The activation energy of impurity diffusion in silicon is smaller than the activation energy of self-diffusion so the ratio of defect annihilation to the rate of impurity diffusion is increased with temperature. Accordingly, higher annealing temperatures are preferable with an upper annealing temperature limited to a suitable temperature for attaining a maximum allowable junction depth.

Amorphous layers are annealed at temperatures from 500° C. to 600° C., recrystallizing the underlying crystalline substrate with impurity atoms moving into substitutional lattice sites during regrowth so that full electrical activation is achieved within the amorphous layer at relatively low temperatures. The impurities that are implanted into the region beyond the amorphous layer are only electrically activated by the higher temperatures for activating impurities in regions of crystalline damage, normally temperatures of 800° C. to 1000° C.

In conventional semiconductor processing, ion implant operations and thermal processing operations are performed in separate processing chambers and at separate times. In typical ion implant processing, no thermal energy is added to the ion implant chamber during ion implantation. Conventional ion implant devices typically use some form of cooling apparatus to prevent heating during implantation and to reduce the temperature of a wafer during implantation since the temperature rises to what are considered high levels when radiant heat loss is the only form of heat dissipation. Recognized problems associated with excessive heating include undesirable partial annealing effects of damage during implantation, and degradation of a photoresist masking layer. Accordingly, some conventional ion implant devices include a cooled wafer holder or platen. In one example, a platen is clamped against a inert gas or Freon-cooled heat sink. Another embodiment uses water-cooled heat sinking.

Attempts to heat a substrate wafer during ion implantation have resulted in a phenomenon called "dynamic annealing", which impacts both implantation damage and the effects of subsequent annealing. (Wolf S. and Tauber R. N., "SILICON PROCESSING FOR THE VLSI ERA, VOLUME 1, PROCESS TECHNOLOGY", 1986, p. 306–307). A rise in temperature increases the mobility of point defects caused by the damage and begins repair of the damage even as the implant is taking place. For the implantation of light ions, heating during implantation may sufficiently repair damage that formation of amorphous layers is prevented, even at high implantation doses. For the implantation of heavy ions, dynamic annealing during implantation can cause amorphous layer growth during implantation. A wafer which is cooled using a cooling device in an ion implanter impacts the structure of damage following implantation as a result of dynamic annealing effects. Specifically, if a substrate wafer is prevented from being significantly heated above room temperature by application of heat sinking during implantation, dynamic annealing is minimized. However, if no heat sinking is applied and substrate wafers are allowed to rise in temperature to a range of approximately 150° C. to 300° C., dynamic annealing effects have been shown to produce unpredictable and undesirable changes in implantation damage structures. The undesirable changes in implantation damage structures include formation of buried amorphous layers or formation of crystalline layers containing high densities of dislocation loops.

What is needed is a technique for implanting ions in a semiconductor substrate, repairing damage caused by the ion implant operation, and activating the implanted ions to form an improved doped substrate for improved device performance.

SUMMARY OF THE INVENTION

In accordance with the present invention, during a semiconductor substrate ion implant process thermal energy is supplied to raise the temperature of the semiconductor wafer. The increased temperature of the semiconductor wafer during implantation acts to anneal the implanted impurities or dopants in the wafer, reducing impurity diffusion and reducing the number of fabrication process steps.

In accordance with an embodiment of the present invention, an ion implant device includes an end station that is adapted for application and control of thermal energy to the end station for raising the temperature of a semiconductor substrate wafer during implantation. The adapted end station includes a heating element for heating the semiconductor substrate wafer, a thermocouple for sensing the temperature of the semiconductor substrate wafer, and a controller for monitoring the sensed temperature and controlling the thermal energy applied to the semiconductor substrate wafer by the heating element.

In accordance with one aspect of the present invention, an ion implant device including a system for applying and controlling thermal energy applied to a semiconductor substrate wafer during ion implantation raises the temperature of the wafer to a temperature that is sufficient to activate impurities within the semiconductor substrate wafer when an ion beam is implanting ions to the wafer, but the temperature is insufficient to activate impurities when the ion beam is inactive.

Several advantages are achieved by the described ion implant and annealing system and operating method. One advantage is that, by annealing a substrate during ion implantation, the effective appearance of the substrate wafer is modified from a crystalline structure to an amorphous structure. An advantage of converting the substrate from a crystalline structure to an amorphous structure is that channeling of the implant impurities is avoided. Simultaneous ion implantation and annealing advantageously improves the control of range statistics of the substrate wafer. Avoidance of channeling advantageously avoids shadowing of an implant so that symmetric regions are implanted. A further advantage of converting the substrate from a crystalline structure to an amorphous structure is that individual dopants or impurities are individually excited without driving or diffusing the impurities too deeply into the substrate so that shallow junctions are advantageously formed and impurities are more completely activated.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE PREFERRED EMBODIMENTS

Figure 1:
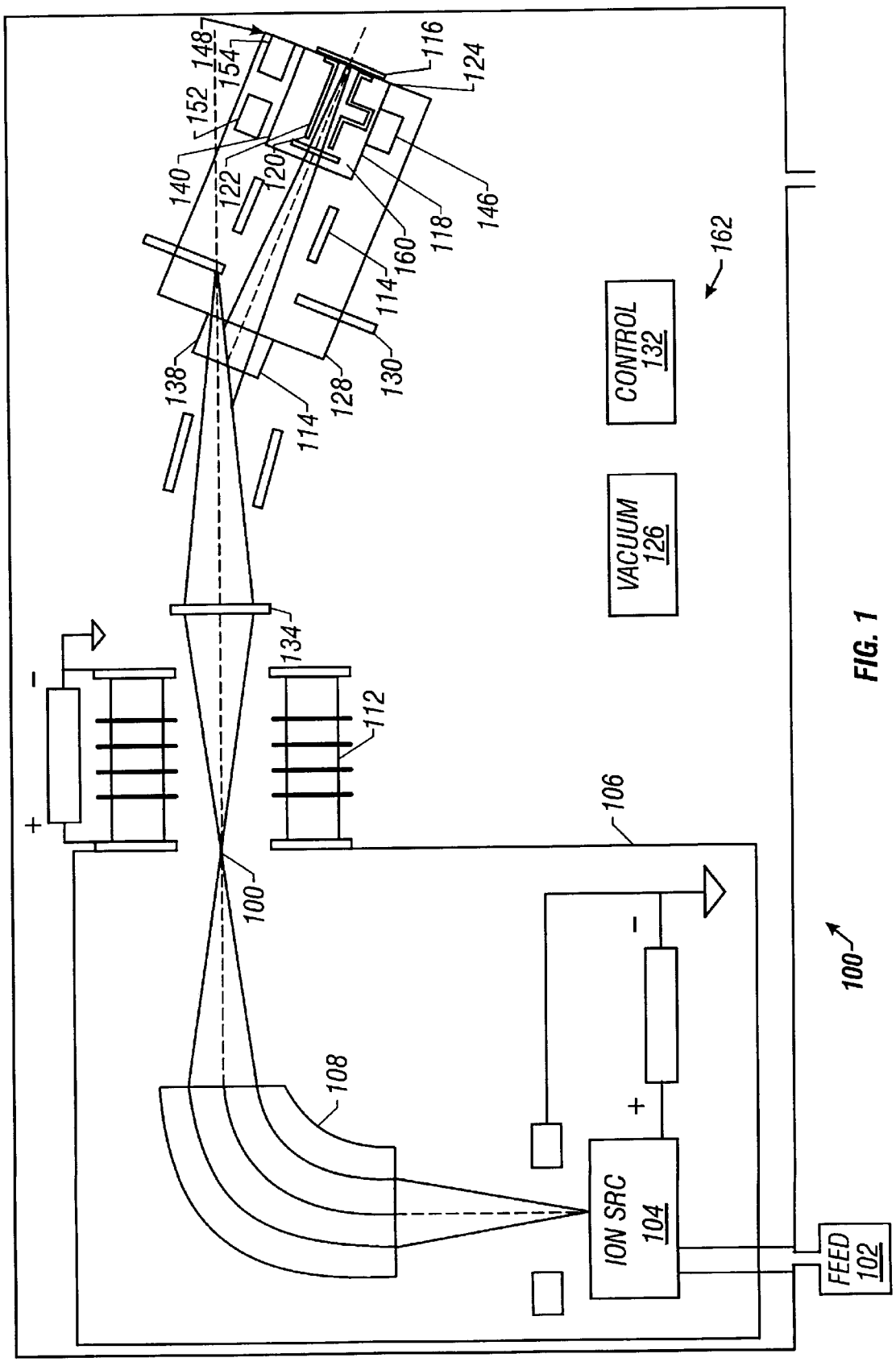
FIG. 1 is a schematic block and pictorial diagram illustrating an embodiment of an ion implant device which includes a thermal energy system for annealing a semiconductor substrate during ion implantation in accordance with an embodiment of the present invention.

Referring to FIG. 1, a schematic block and pictorial diagram illustrates an embodiment of an ion implant device 100 including a thermal energy system for annealing a semiconductor substrate during ion implantation. The ion implant device 100 includes a feed source 102, an ion source 104, an ion extraction and analyzing device 106, an acceleration tube 112, a scanning system 114 including a beam chamber 128, an implanter end station 118 for implanting ions in a substrate wafer 116, a high vacuum system 126, and a controller or computer control system 132.

The feed source 102 is a source of material, typically a gas such as $BF_3$, $BCl_3$, $PH_3$, $AsH_3$, and $SiCl_4$, containing the ion species to be implanted (boron (B), phosphorus (P), and arsenic (As)). An adjustable valve (not shown) controls the flow of a feed gas into the ion source 104.

The ion source 104 includes an ionization chamber (not shown), a separate power supply (not shown) and a vacuum pump (not shown) and functions to ionize the feed gas from the feed source 102. Ions are generally formed by a collision with electrons from an arc discharge or cold cathode source. The ionization occurs in the ionization chamber, which is fed source vapors by the feed source 102 and produces a plasma at a low pressure of about $10^{-3}$ torr. A filament (not shown) is positioned inside the ionization chamber which is heated to a point at which electrons are created from the filament surface. Negatively charged electrons are attracted to an oppositely charged anode in the ionization chamber. As the electrons travel from the filament to the anode, the electrons collide with the dopant source molecules and create multiple positively charged ions from the elements in the molecule.

The ion extraction and analyzing device 106 selects only the ion species of interest according to mass and rejects other species. Typically the ions are extracted from the ion source 104 with voltages of 15–40 keV, and then analyzed. The extracted ion beam is analyzed by spatially separating the beam into a plurality of beams according to ionic mass. The ion beam is a mixture of different fractions of molecules and atoms of the source feed material. For example, $BF_3$ gas dissociates into $B^{++}$, $B^+$, and $BF_2^+$ groups and only one of these ionic groups is implanted at one time. An analyzing magnet 108 separates the ionic groups on the basis that the radius $r_o$ in cm of the arc of a charged ion particle accelerated at a voltage V within the field of the analyzing magnet depends on the mass and charge state of the according to the equation, as follows:

$$r_0 = (143.95/H)(MV/n)^{1/2},$$

where H is the magnetic field in gauss, M is the ionic mass in a.m.u., V is the accelerating voltage, and n is the charge state of the ion. The magnetic field strength is adjusted so that only the ionic species of interest is given the radius of curvature that allows the ionic species to pass through a resolving aperture 110 and into an acceleration tube 112.

The acceleration tube 112 accelerates ions to a sufficiently high velocity that the ion has enough momentum to penetrate the surface of the substrate wafer 102 to an appropriate depth. The velocity is attained using the force of attraction of negative and positive charges. The acceleration tube 112 creates an acceleration field for increasing the ion energy to a desired energy level or decelerating the ion if an energy less than the extracted voltage is utilized. The ion beam is also focused to a particular size and shape.

The ion beam exits the acceleration tube 112 and separates due to repulsion of like charges. The separation or defocus causes uneven ion density and nonuniform layers in the wafer so that focusing of the beam is used to successfully implant the ions. A lens 134, typically either a magnetic lens or an electrostatic lens, is used to focus the ions into a small diameter beam or a band of parallel beams.

The ion beam has a diameter of only about 1 cm to 3 cm so that some form of scanning is used to uniformly dope an entire wafer. The scanning system 114 distributes ions uniformly over the substrate wafer 116 by passing the ion beam between a plurality of electrostatic plates 138. Negative and positive charges are controlled in two dimensions on the electrostatic plates 138 to attract and repel the ionized beam across the entire surface of the substrate wafer 116 in a raster scan pattern. Some ion implanters use beam sweeping to scan the wafer. Other implanters use mechanical scanning by holding the ion beam in one position and moving the wafer. In high-current implanters, wafers are mounted on the periphery of a disk and rotated at approximately 1000 rpm to produce a rotating mechanical scan. A region of a wafer passes before a large defocused ion beam once during a revolution. The ion beam is also scanned linearly across the wafer by electrostatic scanning of the beam or by applying an additional motion to the rotating disk to produce a uniform implant dose across the wafer.

The implanter end station 118 includes an end chamber 140, an area-defining aperture 120, a Faraday cup detector and current integrator 122, and a target holder 124. The end chamber 140 is reinforced to withstand high temperature thermal processing including temperatures of approximately 1000° C. to form a high vacuum heat chamber 160. The implanter end station 118 performs many functions including loading of wafers to the end chamber 140, creating a vacuum, individually placing wafers on the target holder 124, performing the implant operation, dismounting the wafers, loading the wafers to a cassette, and removing the cassette from the end chamber 140. In some embodiments, the end chamber 140 also serves as a plasma etch system 148, including the end chamber 140, a vacuum system 126, a gas supply 152, and a power supply 154. In some embodiments, the plasma etch system 148 is used to degas the substrate wafer 102 by plasma bombardment prior to ion implantation. The plasma etch system 148 generates a vacuum in the end chamber 140 by using the vacuum system 126 to reduce the pressure inside the end chamber 140. The gas supply 152 is activated to fill the end chamber 140 with an etchant gas. For example, degassing of silicon dioxide (oxide) is achieved by supplying as gas including $CF_4$ mixed with oxygen. The power supply 154 creates a radio frequency (RF) field through electrodes (not shown) within the end chamber 140. The RF field energizes the gas mixture to a plasma state. In the energized state the gas, more specifically the fluorine, attacks the substrate (the silicon dioxide) to convert the substrate into volatile components that are removed from the system by the vacuum system 126.

The Faraday cup and current integrator 122 is a detector which directly measures the implant dose by collecting the beam current and integrating over the implant time, thereby "counting" the number of ions impacting the surface of the substrate wafer 116. The Faraday cup and current integrator 122 automates the ion implant process by allowing beam contact with the substrate wafer 116 until the correct dose is achieved. The target holder 124 loads, holds and positions a substrate wafer 116. In one embodiment, wafers are gravity-fed through vacuum locks to a moveable platen and leave the beam chamber 128 through exit locks. The Faraday cage nearly encloses the substrate wafer 116 to prevent loss of electrons arising from secondary electron emission due to the ion beam striking the substrate wafer 116. Lost electrons are absorbed by the walls of the implanter end station 118 resulting in a dose measurement error. The Faraday cage has an opening around the area-defining aperture 120 to allow implanting of ions in the wafer. A negative bias of several hundred volts is applied to the Faraday cage to return most secondary electrons to the wafer target 116, thereby reducing the dose error.

Typically, the implanter end station 118 includes load locks (not shown) that allow loading of the end chamber 140 without breaking the chamber vacuum. Antistatic devices (not shown) are used to maintain a low particulate generation during the mechanical movements within the end chamber 140.

The end chamber 140 includes a heating unit 146 for annealing a wafer during the ion implantation process. In some embodiments, the heating unit 146 is a lamp heating device. In other embodiments, the heating unit 146 is a resistance heating device. The heating unit 146, in combination with the end chamber 140 for serving as an anneal chamber and the computer control system 132 for controlling the timing and thermal energy applied to the substrate wafer 116 from a thermal processing unit 162.

In some embodiments, the heating unit 146 alternatively supplies thermal energy to the implanter end station 118 using lamp heating at a distance from the substrate wafer 116 and supplies thermal energy by applying backside heating to the substrate wafer 116. The usage of backside heating advantageously avoids high temperature conditions in the implanter end station 118. However, the usage of backside heating is not an option for wafers which include a photoresist mask for implant processing since heat from a backside heating element typically exceeds the breakdown temperature of the photoresist mask. A high-temperature inorganic mask may be used in place of a photoresist mask to allow usage of backside heating. High-temperature masks, such as masks composed of plasma nitride or plasma oxide typically withstand temperatures in excess of 1000° C. Usage of a high-temperature polymer mask advantageously avoids temperature breakdown at the expense of adding a process step. Some polyimides have decomposition temperatures in excess of 500° C. and may be used as implant masks.

Temperature breakdown of mask materials is further avoided since the thermal energy that is supplied by the heating unit 146 is substantially reduced from the heating that is conventionally supplied by annealing because the ion beam supplies a large thermal energy that is combined with the thermal energy of simultaneous annealing and ion implantation.

The heating unit 146 restores crystal damage and electrically activates dopants during the ion implant process by a thermal heating operation. The anneal temperature is sufficient to activate a selected dopant when ion beam energy is activated and illuminating the substrate wafer 116 but is inadequate to activate the selected dopant when the ion beam energy is not active. A typical anneal temperature is in a range between approximately 500° C. and 1000° C. in a high vacuum. The anneal temperature is below the diffusion temperature of a particular dopant to prevent lateral diffusion of the dopant.

The high vacuum system 126 evacuates the feed source 102, ion source 104, the acceleration tube 112, the beam chamber 128, and the implanter end station 118 to a pressure less than $10^{-6}$ torr. A strong vacuum is used to reduce the formation of neutrals by collision of beam ions with residual gas atoms. Neutral beam effects are further reduced by offsetting the resolving aperture 110 and wafer target 116 by approximately 5 to 10 degrees and trapping the beam at a beam stop 130. Cryopumps 136 are used to avoid oil backstreaming from diffusion pumps (not shown) into the beam chamber 128 and implanter end station 118.

The computer control system 132 automates operation of the ion implant device 100. More specifically, the computer control system 132 is connected to the feed source 102 to control the flow control of the feed gas into the ion source. The computer control system 132 is connected to the ion source 104 to control the power and pressure for ionizing the feed gas. The computer control system 132 is connected to the ion extraction and analyzing device 106 to control the magnetic field applied to the ions, thereby selecting the ions for inclusion into the ion beam. The computer control system 132 is connected to the scanning system 114 to control the scan position and scanning speed of the ion beam across the substrate wafer 102. The computer control system 132 is connected to the vacuum system 126 to control the pressure within chambers of the ion implant device 100 including the feed source 102, ion source 104, the acceleration tube 112, the beam chamber 128, and the implanter end station 118 to a predetermined pressure including a pressure less than $10^{-6}$ torr. The computer control system 132 is connected to the heating unit 146 to control the thermal energy applied to the substrate wafer 116.

Figure 2:
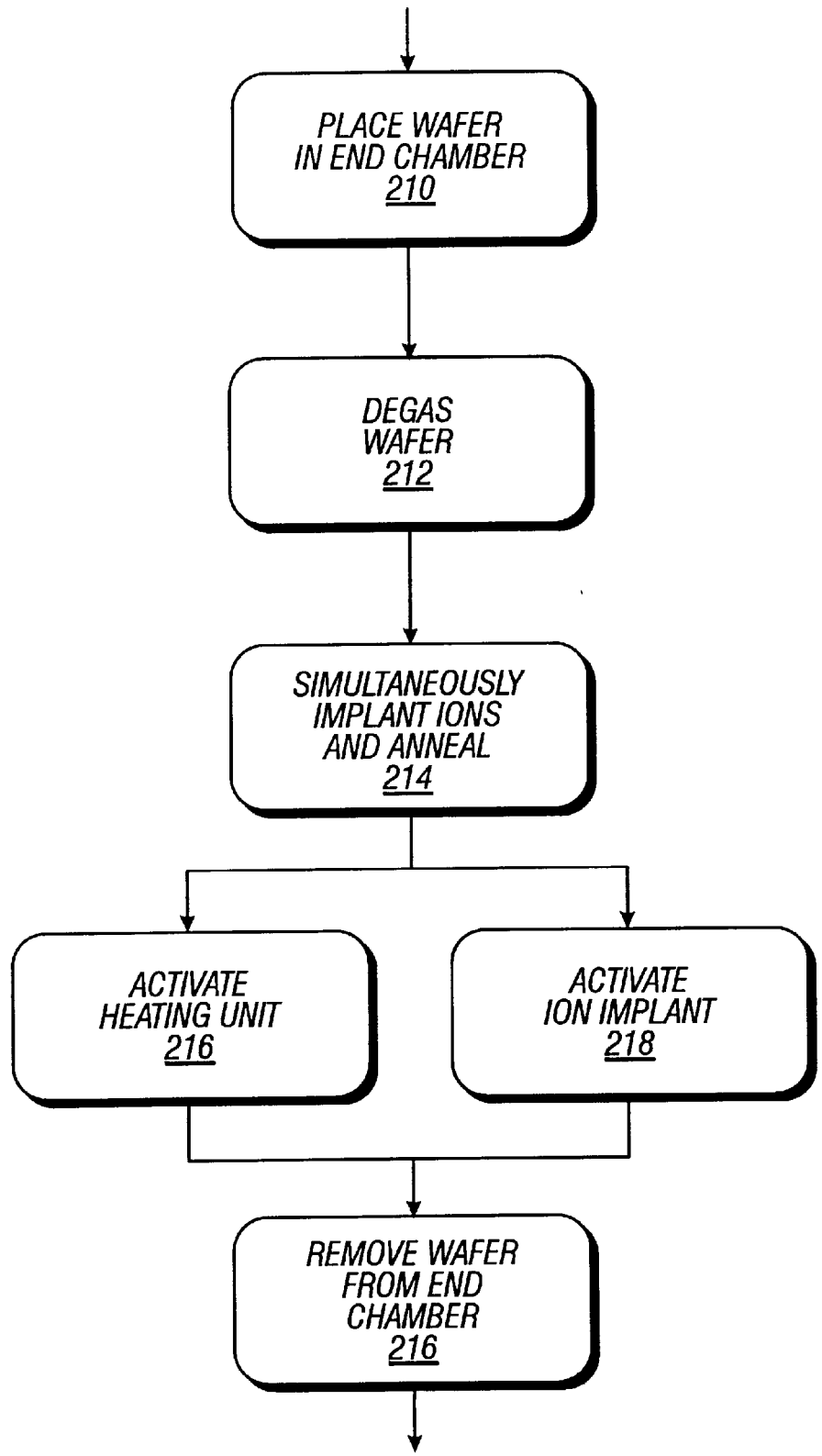
FIG. 2 is a flow chart illustrating a process for implanting ions and simultaneously annealing a substrate wafer using an ion implant device which includes a thermal energy system for annealing a semiconductor substrate during ion implantation.

Referring to FIG. 2 in conjunction with FIG. 1, a flow chart illustrates a process for implanting ions and simultaneously annealing a substrate wafer 116 using an ion implant device 100 including a thermal energy system for annealing a semiconductor substrate during ion implantation.

In step 210, the substrate wafer 102 is placed inside the end chamber 140 and positioned in the substrate wafer 116 held by the target holder 124. In particular, the substrate wafer 116 is gravity-fed through vacuum locks to a moveable platen.

Once the substrate wafer 116 is firmly held by the target holder 124, the substrate wafer 116 is degassed 212, either by activating the heating unit 146 and applying high temperature thermal energy in the form of a heat flash at a temperature up to 600° C. or, in an alternative embodiment, by plasma bombardment using the plasma etch system 148. Degassing of the substrate wafer 116 is useful for avoiding emissions from the substrate wafer 116 during implantation, thereby avoiding modification or contamination of the implant dosage.

Simultaneous ion implantation and thermal annealing 214 is performed by activating heating unit 146 to supply a predetermined thermal energy or a predetermined temperature in step 216 and also activating ion bombardment by the ion implant device 100 in step 218. During the ion implantation and thermal annealing 214 step, the ion implant device 100 applies and controls the thermal energy applied to the substrate wafer 116 during ion implantation to raise the temperature of the substrate wafer 116 to a level that is sufficient to activate impurities within the substrate wafer 116 when an ion beam is implanting ions to the wafer, but the temperature is insufficient to activate impurities when the ion beam is inactive. For example, an implanted wafer that is conventionally processed using rapid thermal annealing at a temperature of 1000° C. to 1050° C. is processed at a much lower thermal energy using simultaneous ion implantation and annealing because the ion beam inherently supplies a high temperature, generally approximately 200° C. but up to 500° C. for high voltage-high current beams. Accordingly, thermal processing that is performed simultaneous with ion implantation supplies a substantially reduced thermal energy to the substrate wafer 116. For an implanted wafer that is conventionally processed using rapid thermal annealing at a temperature of 1000° C. to 1050° C., a reduced-temperature annealing at temperatures from 400° C. to 800° C. may be supplied.

The simultaneous ion implantation and annealing advantageously modify the effective appearance of the substrate wafer 116 to the bombarding ions. In particular, by heating the substrate wafer 116, the substrate changes from a crystalline structure to an amorphous structure due to the effect of vibrations or oscillations of atoms in the substrate wafer 116 in response to heating.

One advantage of the conversion of the substrate from a crystalline structure to an amorphous structure is that channeling of the implant impurities is avoided. In a conventional ion implant operation without thermal processing, implants are made into single-crystal lattices. The single-crystal lattices include crystal lattice directions, called channels, along which ions do not encounter target nuclei so that implanted impurities are channeled or steered to the open channels of the lattice. The implanted impurities penetrate the lattice several times more deeply than amorphous targets. Channeling disadvantageously produces a large sensitivity to incident beam direction, thereby making the result of an implant operation highly variable and channeling effects difficult to control. Thus, simultaneous ion implantation and annealing advantageously improves the control of range statistics of the substrate wafer 102 where range is the distance that an ion travels in a target before coming to rest.

Avoidance of channeling also advantageously avoids shadowing of an implant in which the lattice channel direction may be shadowed by masking material such as photoresist, resulting in unintentional fabrication of asymmetric devices. By applying thermal energy during implantation, an amorphous substrate advantageously avoids shadowing and forms symmetric implant regions.

A further advantage of the conversion of the substrate from a crystalline structure to an amorphous structure is that individual dopants or impurities are individually excited without driving or diffusing the impurities too deep into the substrate so that shallow junctions are advantageously formed and impurities are more completely activated.

An additional advantage of the conversion of the substrate from a crystalline structure to an amorphous structure is that deposition of a blanket oxide layer is made optional. In many conventional semiconductor processing operations, a layer of blanket silicon dioxide (oxide) is deposited on the surface of a substrate wafer to convert the substrate structure at the surface of the wafer to an amorphous structure and thereby avoid the effects of channeling. The illustrative system and method makes the usage of the blanket oxide layer optional since the application of thermal energy to the substrate wafer 102 during implantation inherently converts the substrate wafer 102 to an amorphous structure so that the oxide layer is unnecessary. Optional deletion of a silicon oxide deposition step is advantageous for the processing of some circuits by allowing better control of implantation or diffusion directly into the substrate. Optional deletion of a silicon oxide deposition step is also advantageous for the processing of some circuits by reducing the number of processing steps, thereby reducing fabrication costs.

The substrate wafer 102 is removed from the beam chamber 128 through exit locks (not shown) in step 220.

While the invention has been described with reference to various embodiments, it will be understood that these embodiments are illustrative and that the scope of the invention is not limited to them. Many variations, modifications, additions and improvements of the embodiments described are possible. For example, many various types of heating elements may be used to supply thermal energy to the wafer. The described combination of ion implant device and annealing system is applicable to any suitable implant device using a suitable implant technique and is applicable to any suitable annealing chamber. The implant ions and energies and durations are not limited herein and any suitable ions and energies may be applied. The temperature applied to the end chamber and wafer are illustratively described herein and are not limiting so that the applicable thermal energy supplied to the end chamber and wafer are any suitable temperature in light of the ion beam energy supplied to the wafer.

What is claimed is:

1. A semiconductor processing apparatus for processing a substrate wafer comprising:
    a feed source for supplying implant ions in the form of a feed gas;
    an ion source coupled to the feed source for ionizing the feed gas;
    an ion extracting and analyzing device coupled to the ion source for selecting a predetermined ion species from the ionized feed gas according to mass;
    an acceleration tube coupled to the ion extracting and analyzing device for creating an acceleration field to increase the ion energy of the selected ion species and for creating and focusing an ion beam;
    a beam chamber coupled to the acceleration tube for passing the ion beam to the substrate wafer;
    a scanner coupled to the beam chamber for directing the ion beam through the beam chamber and scanning the ion beam across a surface of the substrate wafer;
    an end station including an area-defining aperture, a Faraday cup and current integrator, and a wafer holder for loading, holding and positioning the substrate wafer;
    a vacuum system coupled for evacuating the end station, the beam chamber and the acceleration tube;
    a heating unit coupled to the end station for generating a thermal energy supplied to the substrate wafer during application of the ion beam to the substrate wafer;
    a controller coupled to the feed source, the ion source, and the ion extracting and analyzing device, the scanner, the vacuum system, and the heating unit for controlling the composition and energy of the ion beam, the physical positioning and timing of the scanner, the pressure within the end station, the beam chamber and the acceleration tube, and the thermal energy supplied to the substrate wafer; and
    an operating logic coupled to the controller for defining functional operations of the controller, the operating logic including a control sequence for simultaneously supplying a predetermined thermal energy to the substrate wafer and generating an ion beam impinging on the substrate wafer, and the operating logic including a control sequence for degassing the substrate wafer by controlling the heating unit to generate a flash heat preceding the step of simultaneously supplying a predetermined thermal energy to the substrate wafer and generating an ion beam impinging on the substrate wafer.

2. A semiconductor processing apparatus according to claim 1 further comprising:
    a plasma etch system including an end chamber coupled to the end station, the vacuum system, a gas supply, and a power supply.

3. A semiconductor processing apparatus according to claim 2 further comprising:
    a controller coupled to the feed source, the ion source, and the ion extracting and analyzing device, the scanner, the vacuum system, and the heating unit for controlling the composition and energy of the ion beam, the physical positioning and timing of the scanner, the pressure within the end station, the beam chamber and the acceleration tube, and the thermal energy supplied to the substrate wafer.

4. A semiconductor processing apparatus according to claim 3 further comprising:
    an operating logic coupled to the controller for defining functional operations of the controller, the operating logic including a control sequence for simultaneously supplying a predetermined thermal energy to the substrate wafer and generating an ion beam impinging on the substrate wafer.

5. A semiconductor processing apparatus according to claim 4 further comprising:
    an operating logic coupled to the controller for defining functional operations of the controller, the operating logic including a control sequence for degassing the substrate wafer by controlling the plasma etch system to bombard the substrate wafer with plasma preceding the step of simultaneously supplying a predetermined thermal energy to the substrate wafer and generating an ion beam impinging on the substrate wafer.

6. A semiconductor processing apparatus for processing a substrate wafer comprising:
    an ion implant device including an end chamber for holding the substrate wafer under process, the ion implant device for generating an ion beam for implanting ions in the substrate wafer;
    a thermal processing unit coupled to the end chamber for generating a thermal energy supplied to the substrate wafer during application of the ion beam to the substrate wafer; and
    a controller coupled to the ion implant device and the thermal processing unit for controlling the composition and energy of the ion beam, the physical positioning and timing of the ion beam in application to the substrate wafer, and the thermal energy supplied to the substrate wafer;
    an operating logic coupled to the controller for defining functional operations of the controller, the operating logic including a control sequence for simultaneously supplying a predetermined thermal energy to the substrate wafer and generating an ion beam impinging on the substrate wafer, the operating logic including a control sequence for degassing the substrate wafer by controlling the heating unit to generate a flash heat preceding the step of simultaneously supplying a predetermined thermal energy to the substrate wafer and generating an ion beam impinging on the substrate wafer.

7. A semiconductor processing apparatus according to claim 6 further comprising:
    a lamp heating device coupled to the thermal processing unit for generating a thermal energy.

8. A semiconductor processing apparatus according to claim 6 further comprising:

a resistance heating device coupled to the thermal processing unit for generating a thermal energy.

9. A semiconductor processing apparatus according to claim 6 further comprising:

an operating logic coupled to the controller for defining functional operations of the controller, the operating logic including a control sequence for simultaneously supplying a predetermined thermal energy to the substrate wafer and generating an ion beam impinging on the substrate wafer.

10. A semiconductor processing apparatus according to claim 6 further comprising:

an operating logic coupled to the controller for defining functional operations of the controller, the operating logic including a control sequence for degassing the substrate wafer by controlling the heating unit to generate a flash heat preceding the step of simultaneously supplying a predetermined thermal energy to the substrate wafer and generating an ion beam impinging on the substrate wafer.

11. A semiconductor processing apparatus according to claim 6 further comprising:

a plasma etch system including the end chamber, a vacuum system, a gas supply, and a power supply.

12. A semiconductor processing apparatus according to claim 11 further comprising:

an operating logic coupled to the controller for defining functional operations of the controller, the operating logic including a control sequence for simultaneously supplying a predetermined thermal energy to the substrate wafer and generating an ion beam impinging on the substrate wafer.

13. A semiconductor processing apparatus according to claim 12 further comprising:

an operating logic coupled to the controller for defining functional operations of the controller, the operating logic including a control sequence for degassing the substrate wafer by controlling the plasma etch system to bombard the substrate wafer with plasma preceding the step of simultaneously supplying a predetermined thermal energy to the substrate wafer and generating an ion beam impinging on the substrate wafer.

14. A method of processing a substrate wafer comprising the steps of:

generating an ion beam impinging on the substrate wafer, the ion beam inherently producing an ion beam inherent thermal energy to the substrate wafer; and supplying a predetermined thermal energy to the substrate wafer using a heating unit simultaneous with the generation of the ion beam impinging on the substrate wafer, the predetermined thermal energy and the ion beam inherent thermal energy in combination supplying a thermal energy sufficient to anneal the substrate wafer; and degassing the substrate wafer by generating a flash heat using the heating unit preceding the steps of simultaneously supplying a predetermined thermal energy to the substrate wafer and generating an ion beam impinging on the substrate wafer.

15. A method of processing a substrate wafer according to claim 14 further comprising the step of:

degassing the substrate wafer by bombarding the substrate wafer with plasma preceding the step of simultaneously supplying a predetermined thermal energy to the substrate wafer and generating an ion beam impinging on the substrate wafer.

16. A method of processing a substrate wafer according to claim 14 further comprising the step of:

supplying a predetermined thermal energy to the substrate wafer using a lamp heating device.

17. A method of processing a substrate wafer according to claim 14 further comprising the step of supplying a predetermined thermal energy to the substrate wafer using a resistance heating device.

18. A semiconductor processing apparatus for processing a substrate wafer comprising:

an ion implant device including an end chamber for holding the substrate wafer under process, the ion implant device for generating an ion beam for implanting ions in the substrate wafer;

a thermal processing unit coupled to the end chamber for generating a thermal energy supplied to the substrate wafer during application of the ion beam to the substrate wafer;

a controller coupled to the ion implant device and the thermal processing unit for controlling the composition and energy of the ion beam, the physical positioning and timing of the ion beam in application to the substrate wafer, and the thermal energy supplied to the substrate wafer; and an operating logic coupled to the controller for defining functional operations of the controller, the operating logic including a control sequence for simultaneously supplying a predetermined thermal energy to the substrate wafer and generating an ion beam impinging on the substrate wafer to a change a portion of the substrate wafer from a crystalline structure to an amorphous structure.

19. A method of processing a substrate wafer comprising the steps of:

generating an ion beam impinging on the substrate wafer, the ion beam inherently producing an ion beam inherent thermal energy to the substrate wafer; and supplying a predetermined thermal energy to the substrate wafer simultaneous with the generation of the ion beam impinging on the substrate wafer, the predetermined thermal energy and the ion beam inherent thermal energy in combination supplying a thermal energy sufficient to anneal the substrate wafer and sufficient to change a portion of the substrate wafer from a crystalline structure to an amorphous structure.

* * * * *